(12) United States Patent
Voogel

(10) Patent No.: US 6,621,289 B1
(45) Date of Patent: Sep. 16, 2003

(54) METHOD AND TEST CIRCUIT FOR DEVELOPING INTEGRATED CIRCUIT FABRICATION PROCESSES

(75) Inventor: Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/896,253

(22) Filed: Jun. 28, 2001

Related U.S. Application Data

(63) Continuation-in-part of application No. 09/139,629, filed on Aug. 24, 1998, now Pat. No. 6,281,696.

(51) Int. Cl.[7] .................. G01R 31/26; G01R 31/02; H01H 31/02
(52) U.S. Cl. .................. 324/765; 324/763; 324/537
(58) Field of Search .................. 324/537, 763, 324/765, 158.1, 73.1, 72.5, 500; 714/724, 725, 733; 257/40, 48, 207, 208, 209; 438/17–19

(56) References Cited

U.S. PATENT DOCUMENTS

| | | | | |
|---|---|---|---|---|
| 4,894,605 A | * | 1/1990 | Ringleb et al. | 324/537 |
| 5,083,083 A | * | 1/1992 | El-Ayat et al. | 324/538 |
| 5,561,367 A | | 10/1996 | Goetting et al. | |
| 5,644,251 A | * | 7/1997 | Colwell et al. | 326/16 |
| 5,670,890 A | * | 9/1997 | Colwell et al. | 324/763 |
| 5,838,163 A | | 11/1998 | Rostoker et al. | |
| 5,969,538 A | * | 10/1999 | Whetsel | 324/763 |
| 6,043,672 A | | 3/2000 | Sugasawara | |
| 6,249,134 B1 | * | 6/2001 | Umeki | 324/763 |
| 6,281,696 B1 | * | 8/2001 | Voogel | 324/763 |
| 6,362,651 B1 | * | 3/2002 | Voogel | 326/41 |
| 6,380,729 B1 | * | 4/2002 | Smith | 324/765 |

OTHER PUBLICATIONS

Steve Wilton, *Fabrication of IC Devices*, "Fabrication—The CMOS PROCESS," EECE 479, 2001, pp. 1–18, available from www.techcd.net; or University of British Columbia.
SG, "Modern VLSI Design 3e,"1998, Chapter 2, pp. 1–46, available from Prentice Hall PTR,2002.

* cited by examiner

*Primary Examiner*—Kamand Cuneo
*Assistant Examiner*—Jermele Hollington
(74) *Attorney, Agent, or Firm*—Pablo Meles; Edel M. Young

(57) ABSTRACT

During the development of process parameters for fabricating an integrated circuit, a test circuit is provided on the wafer that provides rapid identification of process problems. Open circuits are identified by sequentially connecting one end of the conductive paths to the signal source and measuring the current at the other end. Short circuits are identified by sequentially connecting first conductive paths to the signal source and measuring the current generated in the second conductive paths. The location of breaks in the first conductive paths is identified by systematically bypassing sections of the first conductive paths, thereby facilitating failure analysis.

14 Claims, 8 Drawing Sheets

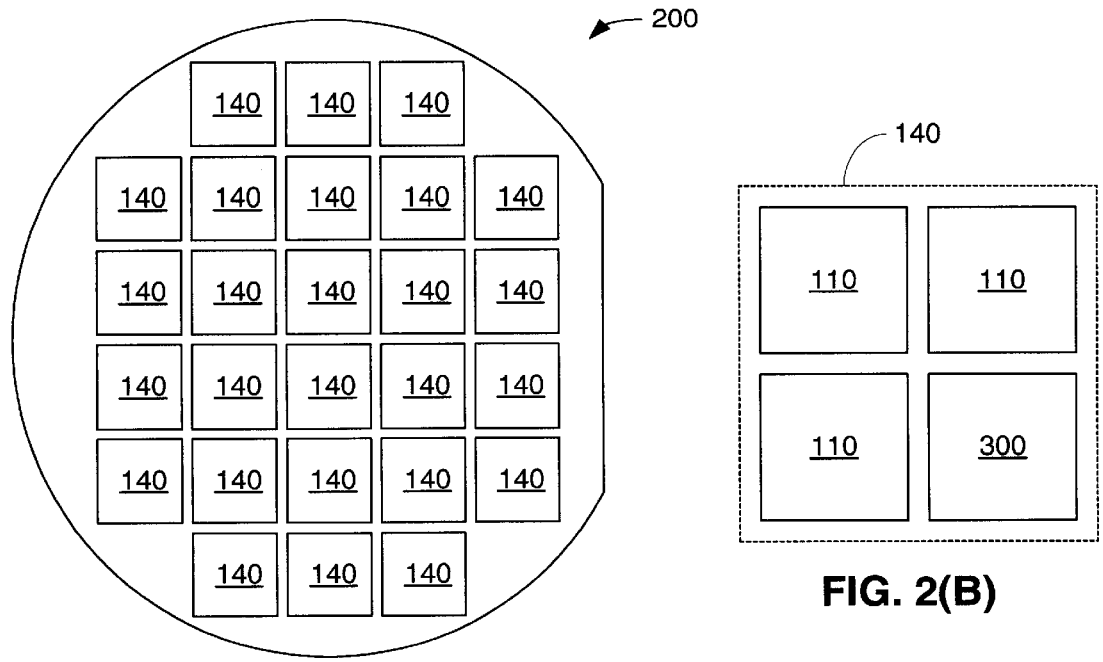
FIG. 2(A)
FIG. 2(B)
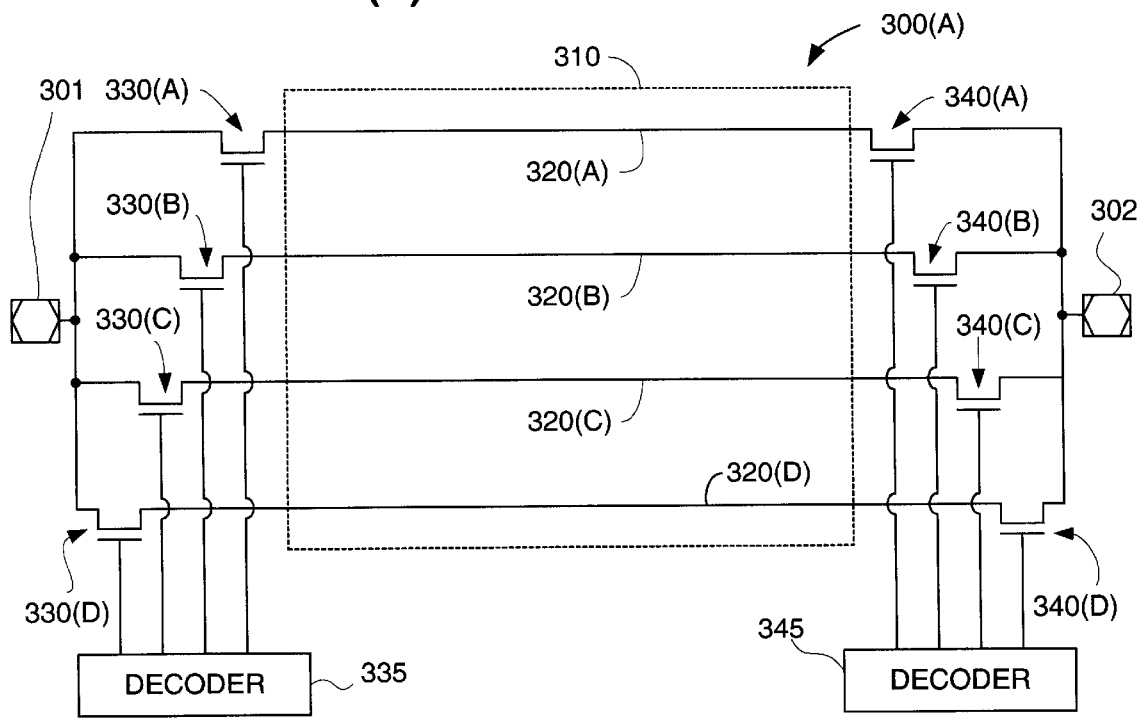
FIG. 3(A)

METHOD AND TEST CIRCUIT FOR DEVELOPING INTEGRATED CIRCUIT FABRICATION PROCESSES

FIELD OF THE INVENTION

This invention relates to integrated circuit (IC) fabrication processes, and in particular to methods and test circuits for locating defects during IC fabrication process development.

BACKGROUND OF THE INVENTION

Integrated Circuit (IC) devices typically include numerous electrical and/or electronic elements that are fabricated on, for example, silicon wafers to perform a particular function. The sequence of steps that occur in the course of manufacturing an IC device can be grouped into two phases: 1) the design phase, and 2) the fabrication phase.

design phase begins by deciding upon the desired functions and necessary operating specifications of the IC device. The IC device is then designed from the "top down"; that is, large functional blocks are first identified, then sub-blocks are selected, and then the logic gates needed to implement the sub-blocks are chosen. Each logic gate is designed through the appropriate connection of, for example, transistors and resistors. The logic gates and other circuit components are then combined to form schematic diagrams. After the various levels of design are completed, each level is checked to insure that correct functionality is achieved, and then test vectors are generated from the schematic diagrams. Next, the circuit is laid out. A layout consists of sets of patterns that will be transferred to the silicon wafer. These patterns correspond to, for example, the formation of transistors and interconnect structures. The layout is designed from the "bottom up"; for example, basic components (e.g., transistors) are first laid out, then logic gates are created by interconnecting appropriate basic components, forming the logic gates into sub-blocks, and finally connecting appropriate sub-blocks to form functional blocks. Power busses, clock-lines, and input-output pads required by the circuit design are also incorporated during the layout process. The completed layout is then subjected to a set of design rule checks and propagation delay simulations to verify that a correct implementation of the circuit design has been achieved. After this checking procedure, the layout is used to generate a set of masks that are used during the fabrication phase to specify the circuit patterns on the silicon wafer.

Specifically, the fabrication phase includes a sequence of process steps during which the set of masks are used to transfer the layout patterns onto a silicon wafer using photolithographic and film formation processes. The process parameters (e.g., temperature, pressure, deposition rates and times, etch rates and times) associated with the process steps are typically developed and refined during an initial development stage. These refined process parameters are then used to produce a final fabrication process that is used during IC production runs.

Test structures formed on the wafer during the development stage of the fabrication phase are utilized to identify the precise structural nature of defects caused by nonoptimal process parameters, thereby facilitating the refinement of the final fabrication process. These test structures are necessary as the physical nature of these defects cannot be discerned from output data of the ICs. Specifically, defects in the ICs produce functional errors in the output data. These functional errors provide little or no information to identify the physical structure causing the defect. As explained in detail below, even with test structures, information about the exact location and nature of the defect is still not readily obtainable. Thus, failure analysis remains difficult and time consuming.

FIG. 1(A) is a plan view showing a conventional semiconductor test wafer 100 including ICs 110 and conventional test structures 120 and 130. Conventional test structures 120 and 130 are often located on test wafer 100 in a "five-s"arrangement (four peripheral locations and one central location, as shown in FIG. 1(A)). Alternatively, test structures 120 and 130 may be located in a "nines" arrangement (not shown), in which test structures 120 and 130 form a cross pattern on the wafer. Conventional test structures 120 and 130 are used to detect defects associated with the various conductive materials that are fabricated during the various process steps.

FIG. 1(B) is a plan view showing a first conventional test structure 120, referred to as a "fork", that is used to detect short circuit defects. Test structure 120 includes a first terminal 121, a second terminal 122, a first fork structure 125 that is connected to first terminal 121 and a second fork structure 126 that is connected to second terminal 122. The "tines" of first fork structure 125 extend between the "tines" of second fork structure 126 such that these "tines" are separated by distances associated with the design specifications of the IC 110 (see FIG. 1(A)). One test structure 120 is formed, for example, during each diffusion formation step, metal formation step and polysilicon formation step associated with the fabrication of the IC. Short circuit defects are detected by applying a voltage source to first terminal 121 and checking for a resulting current at second terminal 122. A current detected at second terminal 122 indicates a short circuit, thereby indicating a potential problem associated with the process step in which the shorted test structure was formed. By locating, magnifying and observing the short circuit defect, failure analysis specialists are able to refine the process step to eliminate defects in subsequent fabrication runs.

FIG. 1(C) is a plan view showing a second conventional test structure 130, referred to as a "serpentine", that is used to detect open circuit defects. Test structure 130 includes a first terminal 131, a second terminal 132 and an elongated conductive path 135 that is connected between first terminal 131 and second terminal 132. One test structure 130 is formed, for example, during each diffusion formation step, metal formation step and polysilicon formation step associated with the fabrication of the IC. Open circuit defects are detected by applying a voltage source to first terminal 131 and checking for a resulting current at second terminal 132. An open circuit defect is detected when a current is not detected at second terminal 132, thereby indicating a potential problem associated with the process step in which the opened test structure was formed. By locating, magnifying and observing the nature of the open circuit defect, failure analysis specialists are able to refine the process step to eliminate defects in subsequent fabrication runs.

A first problem associated with the conventional test structures is that, even if a defect is detected, the precise location of the defect is not readily identifiable. For example, referring to FIG. 1(B), test structure 120 indicates the same short circuit defect whether the actual defect is located at location 128 or location 129. Similarly, referring to FIG. 1(C), test structure 130 indicates the same open circuit defect whether the actual defect is located at location 138 or location 139. Because the location of the actual defect is not readily identifiable, a failure analysis specialist must spend significant amounts of time locating the defect in order to analyze the cause of the defect.

A second problem associated with conventional test structures 120 and 130 is that they cover areas that are typically too small to detect defects at a parts-per-million (PPM) level. That is, because one defect anywhere in the test structure generates a defect detection event, the formation of large test structures is essentially pointless because it would be too difficult to determine whether one, two or twenty defects exist in the structure.

A third problem associated with the conventional test structures 120 and 130 is that each test structure typically indicates problems associated with only one process step or a small number of process steps. Therefore, several test structures (e.g., at least one per process step) must be provided and accessed in order to detect potential defects in all of the process steps performed during a fabrication run.

What is needed is an improved test circuit and method for analyzing test wafers that readily and reliably identifies and isolates fabrication defects, thereby facilitating rapid development and refinement of the fabrication process steps necessary to manufacture IC devices.

SUMMARY OF THE INVENTION

The present invention is directed to a method and a test circuit that provide rapid identification of process problems (i.e., before failure analysis), detect defects down to a part-per-million (PPM) level, and identify the precise location of any defects, thereby facilitating rapid failure analysis during the development and refinement of IC fabrication processes used to fabricate an integrated circuit (IC). Each test circuit identifies process problems associated with any process step by providing data regarding open circuit defects and short circuit defects in the conductive paths, vias and contacts used to generate the IC. Each test circuit includes multiple elongated conductive paths formed from the various conductive materials (i.e., the first metal layer) associated with the ICs, and switching circuitry that allows detection of defects along a selected one of the conductive paths. This provides data regarding, for example, a problem with the first metal layer when the associated conductive paths of all test circuits include defects. Further, each test circuit includes special structures that identify the precise location of the defect on the conductive path, thereby facilitating rapid failure analysis by reducing the amount of time required to isolate the defect for microscopic observation.

In accordance with a first embodiment of the present invention, the test circuit includes adjacent conductive paths that are selectively connected to a signal source by a switching circuit. The conductive paths are formed, for example, during the fabrication of diffusion, metal and polysilicon layers associated with the fabrication of an actual IC on the wafer. The switching circuit sequentially connects a first end of each conductive path to the signal source. Currents are measured at a second end of the conductive paths. An open circuit is identified when a particular conductive path connected to the signal source fails to generate a current at its second end. The particular conductive path is identified through the switching circuit, thereby indicating, for example, which of the diffusion, metal and polysilicon layers includes the open circuit. With this information, the process step associated with the production of the particular conductive path can be refined to eliminate the defect.

In a second embodiment, the test circuit includes perpendicular sets of overlapping first and second conductive paths, and short conductive segments extending in close proximity with a first set of conductive paths. The short conductive segments are electrically connected (through vias or contacts) to the second set of conductive paths. The first conductive paths and associated conductive segments are formed, for example, during the fabrication of diffusion, metal and polysilicon layers associated with the fabrication of an actual IC on the wafer. Short circuits are identified by sequentially connecting the first conductive paths to the signal source, and sequentially measuring the current generated in the second conductive paths. When a short circuit (i.e., contact) occurs between one of the first conductive paths and one of its associated conductive segments, a current is measured in the second conductive path connected to that segment. By knowing which conductive segment is shorted to a first conductive path, failure analysis is greatly facilitated because the location of the short circuit is precisely identified, thereby reducing the amount of time required to isolate the short circuit for observation.

In a third embodiment, the test circuit includes perpendicular first and second sets of overlapping conductive paths. Adjacent pairs of second conductive paths are selectively connected by an associated bypass circuit. Each bypass circuit includes a pass transistor whose gate is controlled to selectively connect an associated pair of adjacent second conductive paths. When an open circuit is detected in one of the second conductive paths, the location of the break is identified by systematically bypassing sections of the second conductive paths using the bypass circuits. By knowing which segment of the second conductive path includes the break, failure analysis is greatly facilitated by allowing immediate isolation of the break for observation. The pass transistors of the bypass circuits can be controlled by the signal used to control the switching circuits associated with the first conductive paths, or controlled by a separate control signal.

BRIEF DESCRIPTION OF THE DRAWINGS

FIG. 2(A) is a plan view showing a semiconductor wafer including ICs and test circuits in accordance with the present invention.

FIG. 2(B) is a plan view showing an arrangement of ICs and test circuits on the semiconductor wafer shown in FIG. 2(A).

FIG. 3(A) is a schematic diagram showing a test circuit in accordance with a first embodiment of the present invention.

DETAILED DESCRIPTION OF THE DRAWINGS

Figure 1A:
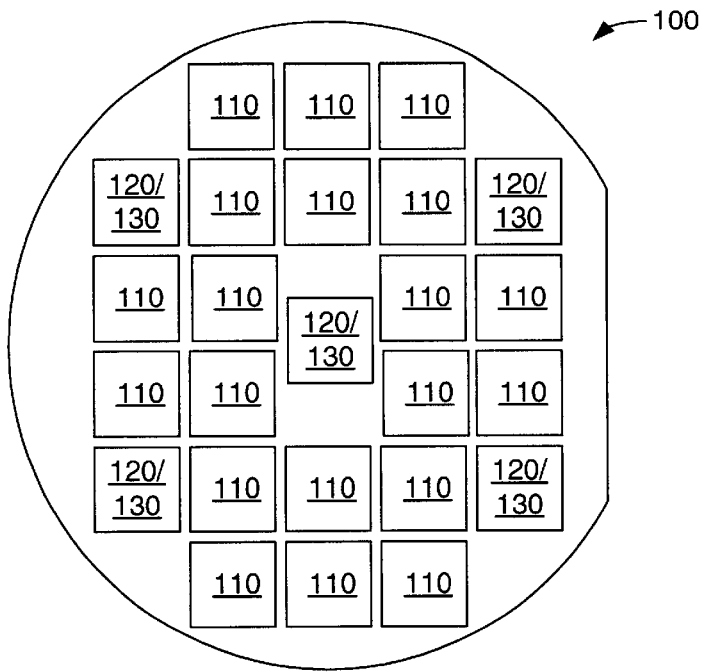
FIG. 1(A) is a plan view showing a semiconductor wafer including ICs and conventional test circuits.
Figure 1B:
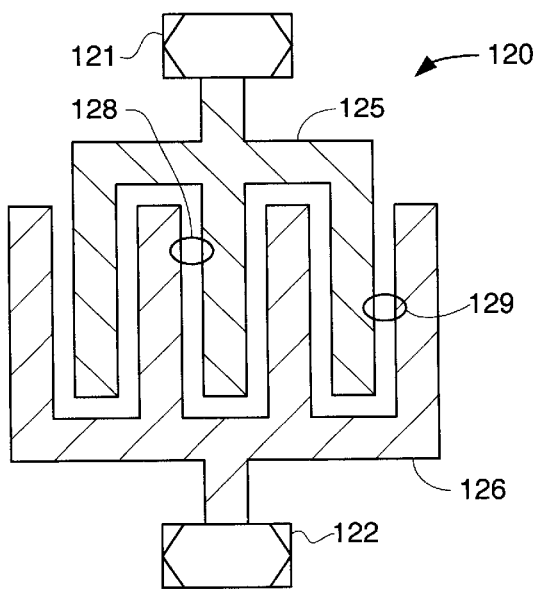
FIGS. 1(B) and 1(C) are plan views showing conventional test circuits.
Figure 1C:
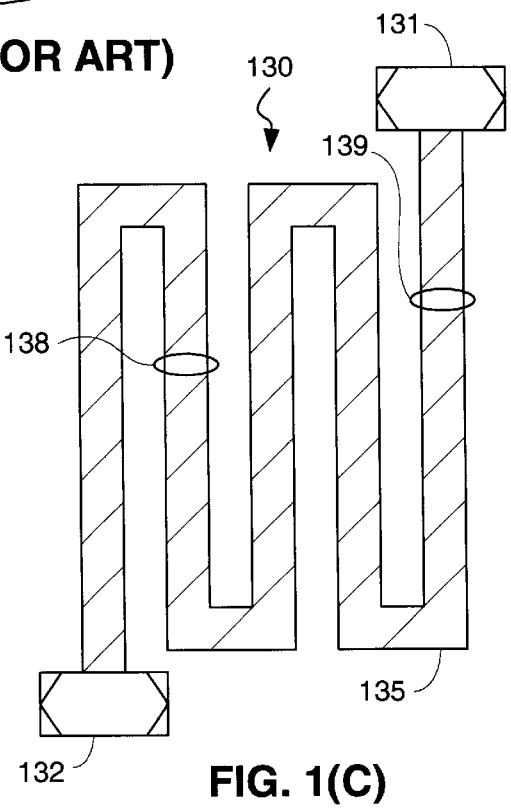

FIGS. 2(A) and 2(B) are diagrams illustrating the arrangement of ICs 110 and test circuits 300 on a semiconductor wafer 200 in accordance with an embodiment of the present invention. Referring to FIG. 2(A), wafer 200 includes several IC regions 140 that are fabricated in rows and columns on a surface thereof. As shown in FIG. 2(B), each IC region 140 includes one or more ICs 110 (such as application specific ICs (ASICs) or programmable logic devices (PLDs)), and one test circuit 300. By including one test circuit 300 in each IC region 140, wafer 200 is provided with multiple test circuits 300 that are uniformly dispersed over the surface of wafer 200. As discussed in detail below, each test circuit 300 generates a large amount of statistical data. By providing a large number of uniformly dispersed test circuits 300, the cumulative statistical data can be used to identify the nature and location of processing defects with a high degree of accuracy, even before actual failure analysis is performed. Of course, in another embodiment, test circuits 300 may be dispersed in the "fives" or "nines" arrangement described above with respect to conventional test structures 120 and 130 (see FIG. 1(A)), but these arrangements would not provide the quality of statistical data provided by the arrangement shown in FIG. 2(A).

In accordance with the present invention, test circuits 300 provide rapid identification of process problems (i.e., before failure analysis), detect defects down to a part-per-million (PPM) level, and identify the precise location of any defects, thereby facilitating rapid failure analysis during the development and refinement of IC fabrication processes used to fabricate ICs 110. In particular, each test circuit 300 identifies process problems associated with any process step by providing data regarding open circuit defects and short circuit defects in the conductive paths, vias and contacts used to generate the ICs. Each test circuit 300 includes multiple elongated conductive paths formed from the various conductive materials (i.e., the first metal layer) associated with the ICs 110, and switching circuitry that allows detection of defects along a selected one of the conductive paths. This provides data regarding, for example, a problem with the first metal layer when the associated conductive paths of all test circuits 300 include defects. Further, each test circuit 300 includes special structures that identify the precise location of the defect on the conductive path, thereby facilitating rapid failure analysis by reducing the amount of time required to isolate the defect for microscopic observation.

FIGS. 3(A) through 3(D) show simplified test circuits that include features associated with test circuits in accordance with the present invention. The features shown in FIGS. 3(A) through 3(D) may be utilized independently, or combined to form a single test circuit 300.

FIG. 3(A) is a simplified diagram showing a test circuit 300(A) in accordance with a first embodiment of the present invention. Test circuit 300(A) is connected between a first terminal 301 and a second terminal 302, and includes generally parallel conductive paths 320(A) through 320(D) that pass through a core area 310. (In FIG. 3A, the paths are shown as parallel, but typically deviate from being straight lines in order to meet design rules and to match the layout style of a commercial product that is less easy to test.) Located at each end of conductive paths 320(A) through 320(D) are switching circuits that facilitate selective connection of conductive paths 320(A) through 320(D) to first terminal 301 and second terminal 302, respectively.

In the embodiment disclosed in FIG. 3(A) each switching circuit of test circuit 300(A) includes pass transistors that are controlled by decoders 335 and 345 to selectively connect a selected conductive path between first terminal 301 and second terminal 302. Specifically, a first switching circuit includes first pass transistors 330(A) through 330(D) that are respectively connected between first ends of conductive paths 320(A) through 320(D) and first terminal 301, each pass transistor 330(A) through 330(D) having a gate that is controlled by a first decoder 335. In addition, a second switching circuit includes second pass transistors 340(A) through 340(D) that are respectively connected between second ends of conductive paths 320(A) through 320(D) and second terminal 302, each pass transistor 340(A) through 340(D) having a gate that is controlled by a second decoder 345. Although a single decoder may be used in place of separate decoders 335 and 345, advantages associated with the use of separate decoders will become apparent from the discussion below.

Decoders 335 and 345 provide control signals that connect a selected conductive path 320(A) through 320(D) during an open circuit defect detection process. Specifically, decoder circuit 335 receives address information from a control system (not shown), and generates control signals that turns on (closes) one of pass transistors 330(A) through 330(D) associated with the selected conductive path 320(A) through 320(D), thereby connecting the selected conductive path to first terminal 301. Similarly, decoder circuit 345 receives address information from the control system (not shown), and generates control signals that turns on (closes) one of pass transistors 340(A) through 340(D) associated with the selected conductive path, thereby connecting the selected conductive path to second terminal 302.

During an open circuit defect detection process, a voltage source (not shown) is connected to first terminal 301 and a current measurement device (e.g., a sense amplifier) (not shown) is connected to second terminal 302. When decoders 335 and 345 generate control signals that are applied, for example, to the gates of first pass transistor 330(A) and second pass transistor 340(A), these pass transistors turn on, thereby causing current to flow from first terminal 301 to second terminal 302. If conductive path 320(A) is defect-free, then a current is detected at second terminal 302 by the current measurement device. Conversely, an open circuit defect on conductive path 320(A) is detected when current is not measured at second terminal 302. While conductive path 320(A) is connected between first terminal 301 and second terminal 302, the remaining first pass transistors 330(B) through 330(D) and second pass transistor 340(B) through 340(D) remain turned off. After conductive path 320(A) is analyzed, first pass transistor 330(A) and second pass transistor 340(A) are turned off and decoder 335 selects another conductive path. In this manner, decoder 335 sequentially connects all of conductive paths 320(A) through 320(D) between first terminal 301 and second terminal 302 for analysis.

Conductive paths 320(A) through 320(D) are formed, for example, during the fabrication of diffusion, metal and polysilicon regions and vias/contacts between these regions that are used to fabricate IC 110 on test wafer 200 (see FIG. 2). For example, conductive path 320(A) may be formed from N-type diffusion material during N-diffusion process steps utilized to form source/drain regions for the transistors of IC 110. Similarly, conductive path 320(B) may be formed from metal material deposited during "metal one" (Ml) formation of metal conductors used to transmit signals to the source/drain regions of the transistors of IC 110. Conductive path 320(C) may include short pieces of Ml material, short pieces deposited during "metal two" (M2) formation, and metal "vias" similar to those used to conduct signals between Ml and M2 lines in IC 110. As a final example, conductive path 320(D) may include short N-diffusion regions linked by short pieces of M1 material that contact the surface of wafer 200 over these N-diffusion regions. By forming the conductive paths of test circuit 300 from different conductive materials, a single test circuit 300 may be used to provide information about several process steps. Further, when multiple test circuits 300 are dispersed over wafer 200, as shown in FIGS. 2(A) and 2(B), statistical data is generated that can be used to readily identify problems associated with a particular process step.

Figure 3B:
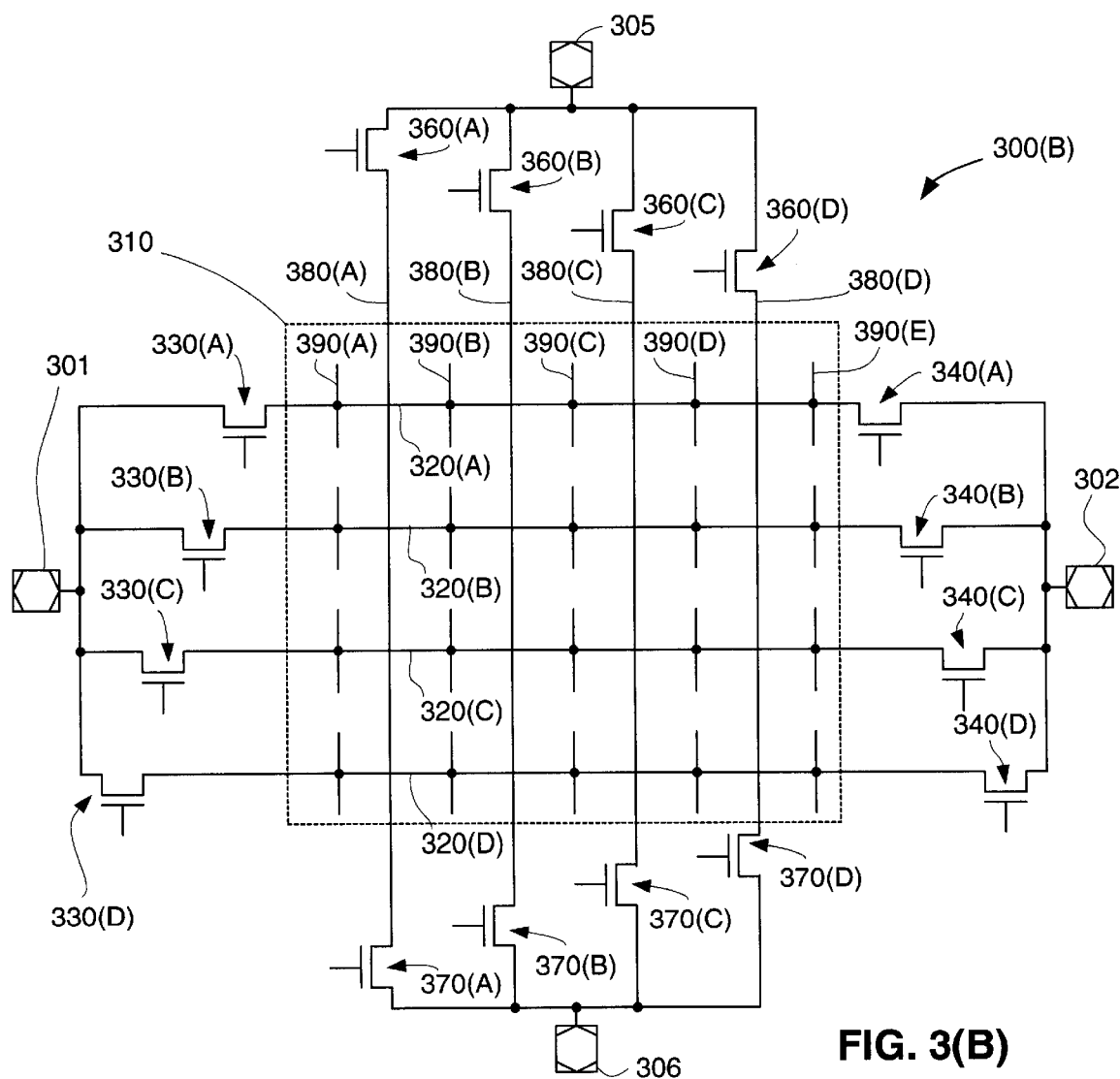
FIG. 3(B) is a schematic diagram showing a test circuit in accordance with a second embodiment of the present invention.

FIG. 3(B) is a simplified diagram showing a test circuit 300(B) in accordance with a second embodiment of the present invention. Test circuit 300(B) includes conductive paths 320(A) through 320(D) utilized in the first embodiment, a second set of conductive paths 380(A) through 380(D) that extend over (or under) conductive paths 320(A) through 320(D), and several short conductive segments 390(A) through 390(E) that are formed next to conductive paths 380(A) through 380(D) and connected to conductive paths 320(A) through 320(D). Conductive paths 320(A) through 320(D) are electrically isolated from conductive paths 380(A) through 380(D).

Conductive paths 380(A) through 380(D) are formed in the manner similar to that described above regarding conductive paths 320(A) through 320(D). Conductive paths 380(A) through 380(D) extend in the same direction through core area 310, and are selectively connected between a third terminal 305 and a fourth terminal 306 by a switching circuit including third pass transistors 360(A) through 360(D) and fourth pass transistors 370(A) through 370(D). In addition to their orientation, conductive paths 380(A) through 380(D) differ from conductive paths 320(A) through 320(D) in that they are formed during process steps performed after (or before) the process steps used to form conductive paths 320(A) through 320(D). Conductive paths 380(A) through 380(D) may be used to provide open circuit defect analysis for the process steps performed after (or before) the process steps used to form conductive paths 320(A) through 320(D).

Figure 3C:
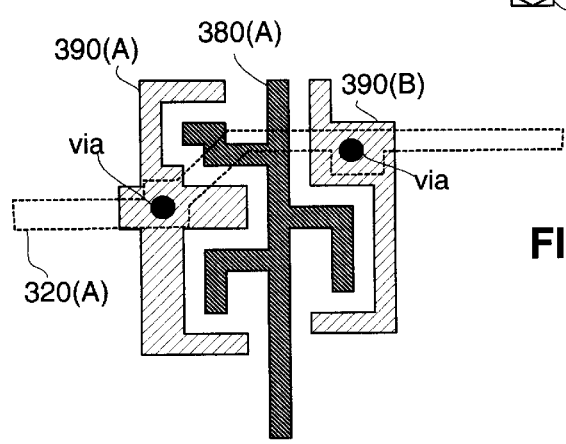
FIG. 3(C) shows a detailed layout of a portion of FIG. 3(B).

In addition, each conductive path 320(A) through 320(D) is connected to a set of short conductive segments 390(A) through 390(D), as discussed below. Short conductive segments 390(A) through 390(E) are provided for short circuit defect detection analysis for the process steps used to form conductive paths 380(A) through 380(D). Each short conductive segment extends close to an associated one of the conductive paths 380(A) through 380(D), and is spaced from its associated conductive path by a distance determined by the design specifications associated with IC 110 (see FIG. 2). This distance is typically the minimum spacing design rule, but may be made less than the minimum spacing design rule in order to test the process margins. Of course, sections of the short conductive segments may be greater than the minimum spacing design rule in order to reach contacts or to accommodate other structures. For example, short conductive segment pairs 390(A) and 390(B) extend along opposite sides of conductive path 380(A). FIG. 3(C) shows in detail a possible layout of segment pairs 390A and 390B adjacent to conductive path 380A, and connected through vias to conductive path 320A, illustrating that even though the conductive lines are not straight, the short segments are shaped to be close enough for detecting short circuit defects. A short circuit defect caused, for example, by contact between conductive path 380(A) and conductive segments 390(A) is detected by applying a current to conductive path 320(A) and measuring the resulting current on conductive path 380(A). Under these conditions, the current on conductive path 380(A) identifies the location of the short circuit on test circuit 300(B) as being along conductive segment 390(A). By identifying that conductive segment 390 (A) is shorted to conductive path 380(A), failure analysis is greatly facilitated because the location of the short circuit is precisely identified, thereby reducing the amount of time required to isolate the short circuit defect for observation. In addition, because the precise location of each defect can be identified, test circuit 300(B) can be formed over a substantially larger area than conventional test structures. This large size allows test circuit 300(B) to detect defects at a PPM level. Further, when several short circuit defects are detected, test circuit 300(B) can be used to provide immediate statistical data indicating whether the defects are clustered or dispersed, thereby providing valuable information to process development engineers even before the start of failure analysis.

Figure 3D:
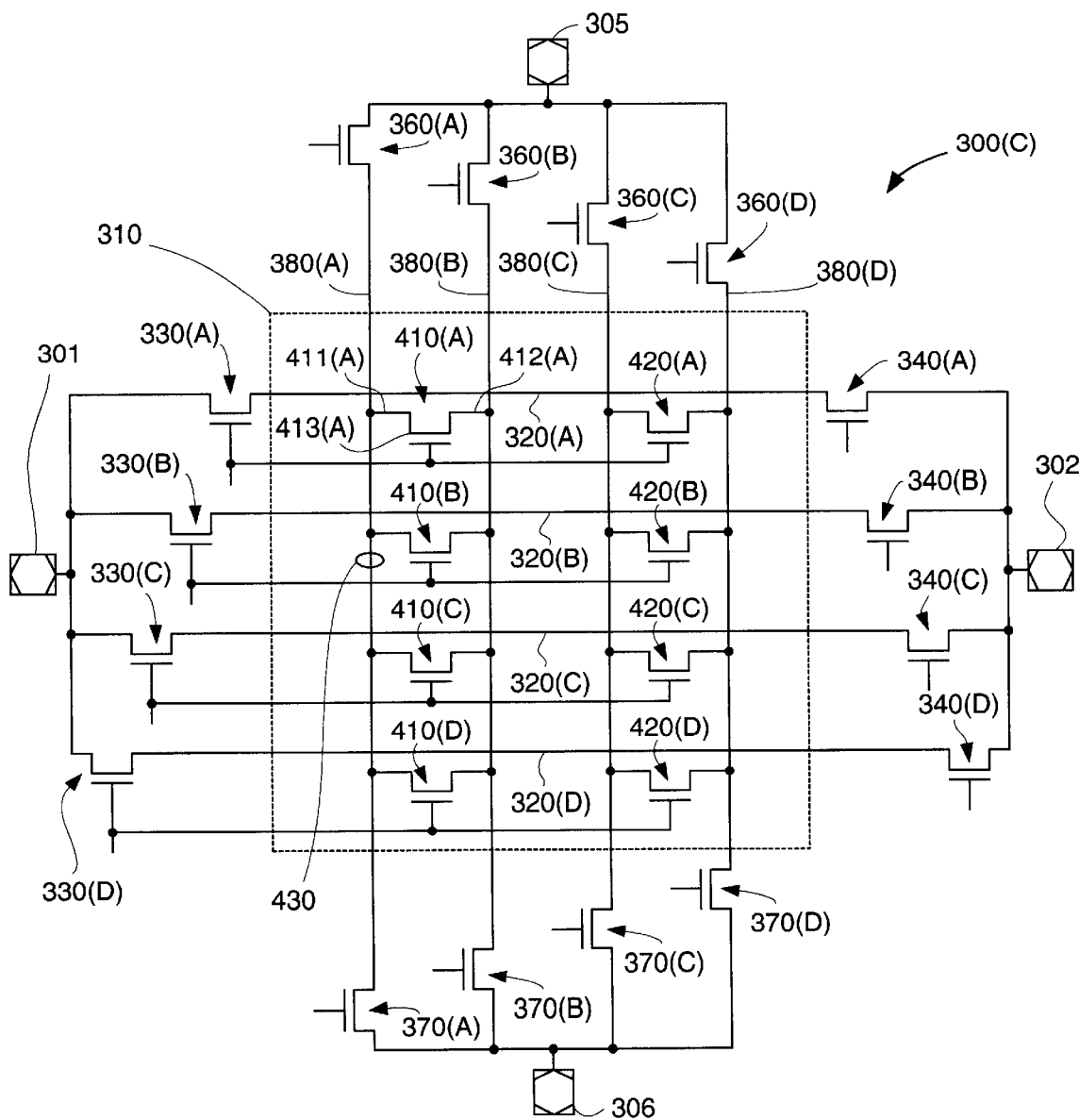
FIG. 3(D) is a schematic diagram showing a test circuit in accordance with a third embodiment of the present invention.

FIG. 3(D) is a schematic diagram showing a test circuit 300(C) in accordance with a third embodiment of the present invention. Test circuit 300(C) includes conductive paths 320(A) through 320(D) utilized in the first embodiment, the second set of conductive paths 380(A) through 380(D) that extend over (or under) conductive paths 320(A) through 320(D), and several bypass circuits 410(A) through 410(D) and 420(A) through 420(D) that are connected between adjacent pairs of conductive paths 380(A) through 380(D). Conductive paths 320(A) through 320(D) are electrically isolated from conductive paths 380(A) through 380(D).

Each bypass circuit 410(A) through 410(D) and 420(A) through 420(D) includes a first segment connected to a first conductive path, a second segment connected to a second conductive path, and a pass transistor connected between the first and second segments. For example, bypass circuit 410(A) includes a first segment 411(A) connected to conductive path 380(A), a second segment 412(A) connected to conductive path 380(B), and pass transistor 413(A) connected between first segment 411(A) and second segment 412(A). In the disclosed embodiment, the gate of pass transistor 413(A) is controlled by the same decoder (not shown) used to control pass transistor 330(A). In another embodiment, the gate of pass transistor 413(A) may be controlled by a separate control circuit (not shown).

In accordance with the third embodiment, test circuit 300(C) indicates the precise location of open circuit defects on conductive paths 380(A) through 380(D) by systematically bypassing sections of conductive paths 380(A) through 380(D) using bypass circuits 410(A) through 410(D) and 420(A) through 420(D). For example, if an open circuit defect exists at point 430 on conductive path 380(A), the open circuit defect can be isolated to the portion of conductive path 380(A) extending between bypass circuits 410(B) and 410(C) by bypassing the defective portion. Specifically, the defective portion of conductive path 380(A) is bypassed by turning on the pass transistors of bypass circuits 410(B) and 410(C), thereby providing an unbroken signal path around the defective portion that passes through a portion of conductive path 380(B). By knowing which portion of the conductive path 380(A) includes the open circuit defect, failure analysis is greatly facilitated because of the reduced amount of time required to isolate and observe the defect. In addition, because the precise location of each defect can be identified, test circuit 300(C) can be formed over a substantially larger area than conventional test structures. This large size allows test circuit 300(C) to detect defects at a PPM level. Further, when several open circuit defects are detected, test circuit 300(C) can be used to provide immediate information regarding whether the defects are clustered or dispersed, i.e. information that is used by process development engineers to determine the cause of the defects.

In accordance with another aspect of the present invention, a test circuit having the features described above is utilized to generate statistical data that allow failure analysis specialists to quickly determine the cause and nature of defects associated with a fabrication run. This statistical data is based on information generated by a large number of conductive paths that are systematically connected between a voltage source and a measurement device, such as a sense amplifier.

Figure 4:
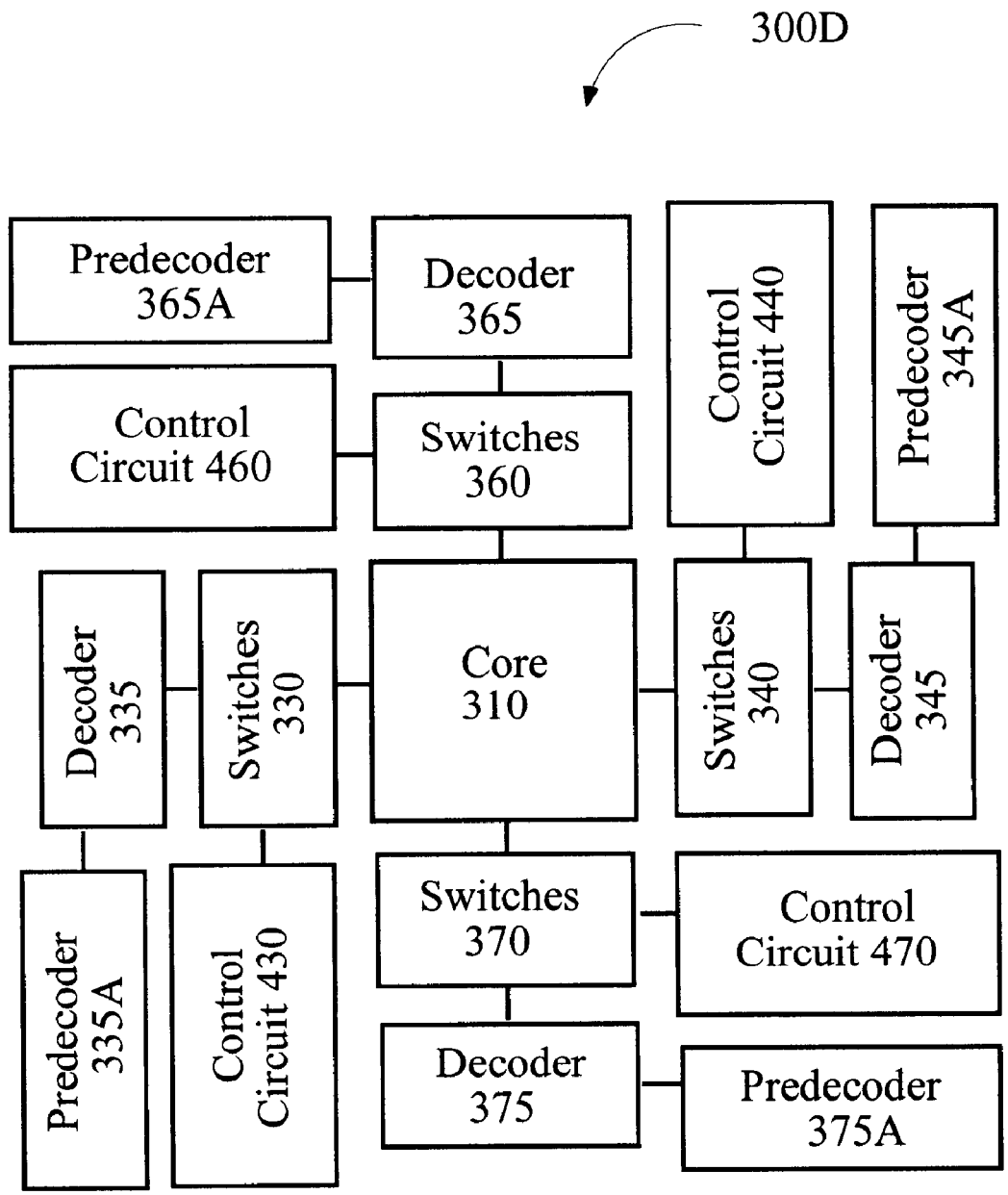
FIG. 4 is a block diagram showing a test circuit in accordance with a fourth embodiment of the present invention.

FIG. 4 is a block diagram illustrating a test circuit 300(D) formed in accordance with a fourth embodiment of the present invention. Test circuit 300(D) includes a core 310 in which multiple horizontal and vertical conductive paths (not shown) are arranged that include the features described above. Switches 330 and 340 connect the horizontal conductive paths to control circuits 430 and 440, respectively; in response to signals generated by predecoders 335A and 345A, and decoders 335 and 345. Similarly, switches 360 and 370 connect the vertical conductive paths to control circuits 460 and 470, respectively, in response to signals generated by predecoders 365A and 375A, and decoders 365 and 375. Predecoders 335A, 345A, 365A and 375A receive address signals that are generated by an off-wafer test system (not shown) via a plurality of contact pads (also not shown). Control circuits 430, 440, 460 and 470 receive mode control signals from the contact pads as well. In response to these mode control signals, control circuits 430, 440, 460 and 470 configure test circuit 300(D) by selectively connecting the terminals 301, 302, 305 and 306 (FIG. 3B), respectively, to a sense amplifier (not shown) or a voltage source (also not shown) whose potential is applied through the contact pads. Currents detected by the sense amplifier are transmitted to the test system through the contact pads. Examples of various configurations of test circuit 300(D) are provided below with reference to FIGS. 5(A) through 5(C).

Figure 5A:
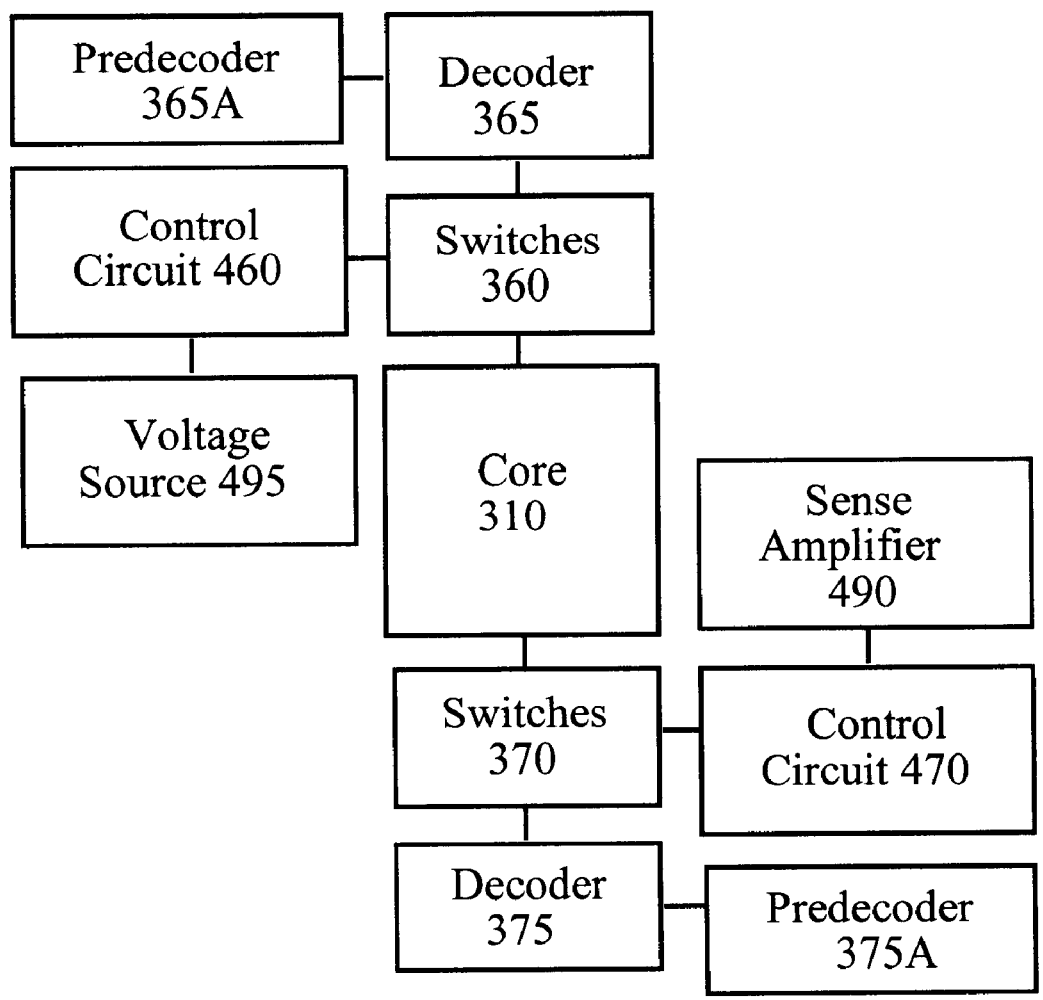
FIGS. 5(A), 5(B) and 5(C) are block diagrams showing various configurations of the test circuit shown in FIG. 4.

FIG. 5(A) illustrates a first configuration of test circuit 300(D) in which vertical conductive paths are selectively connected between a sense amplifier 490 and a power line (voltage source) 495 to perform open circuit defect detection on the vertical paths. In response to mode control signals received by control circuits 460 and 470, switches 360 are connected to voltage source 495 and switches 370 are connected to sense amplifier 490. Address signals are then transmitted to predecoders 365A/375A and decoders 365/375, thereby causing selected switches to turn on to connect a selected vertical conductive path to voltage source 495. When the selected vertical conductive path does not include an open circuit defect, current is detected by sense amplifier 490, which transmits a signal indicating this detection to the test system. Similarly, when the selected vertical conductive path includes an open circuit, a signal is transmitted from the sense amplifier that no current was detected. After all of the vertical conductive paths are sequentially tested for defects, the mode control signal is changed to test the horizontal conductive paths.

Figure 5B:
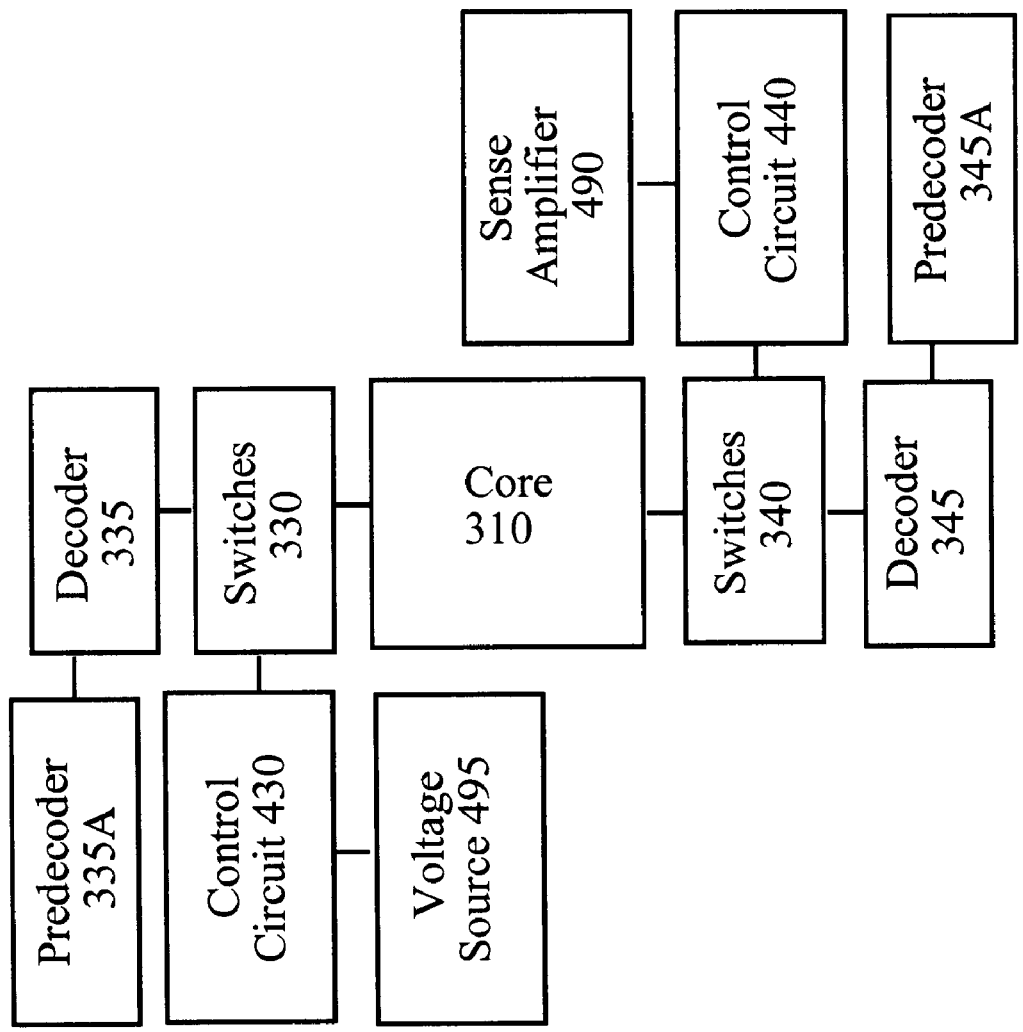

FIG. 5(B) illustrates a second configuration of test circuit 300(D) in which horizontal conductive paths are selectively connected between sense amplifier 490 and voltage source 495 to perform open circuit defect detection on the horizontal paths. Mode control signals received by control circuits 430 and 440 connect switches 330 to voltage source 495 and switches 340 to sense amplifier 490. Address signals are then transmitted to predecoders 335A/345A and decoders 335/345, thereby causing selected switches to turn on to connect a selected horizontal conductive path to voltage source 495. Sense amplifier 490 generates signals associated with each selected horizontal path indicating the presence or absence of defects. After open circuit defect detection is completed, the mode control signals transmitted to control circuits 430, 440, 460 and 470 are altered to perform short circuit defect detection.

Figure 5C:
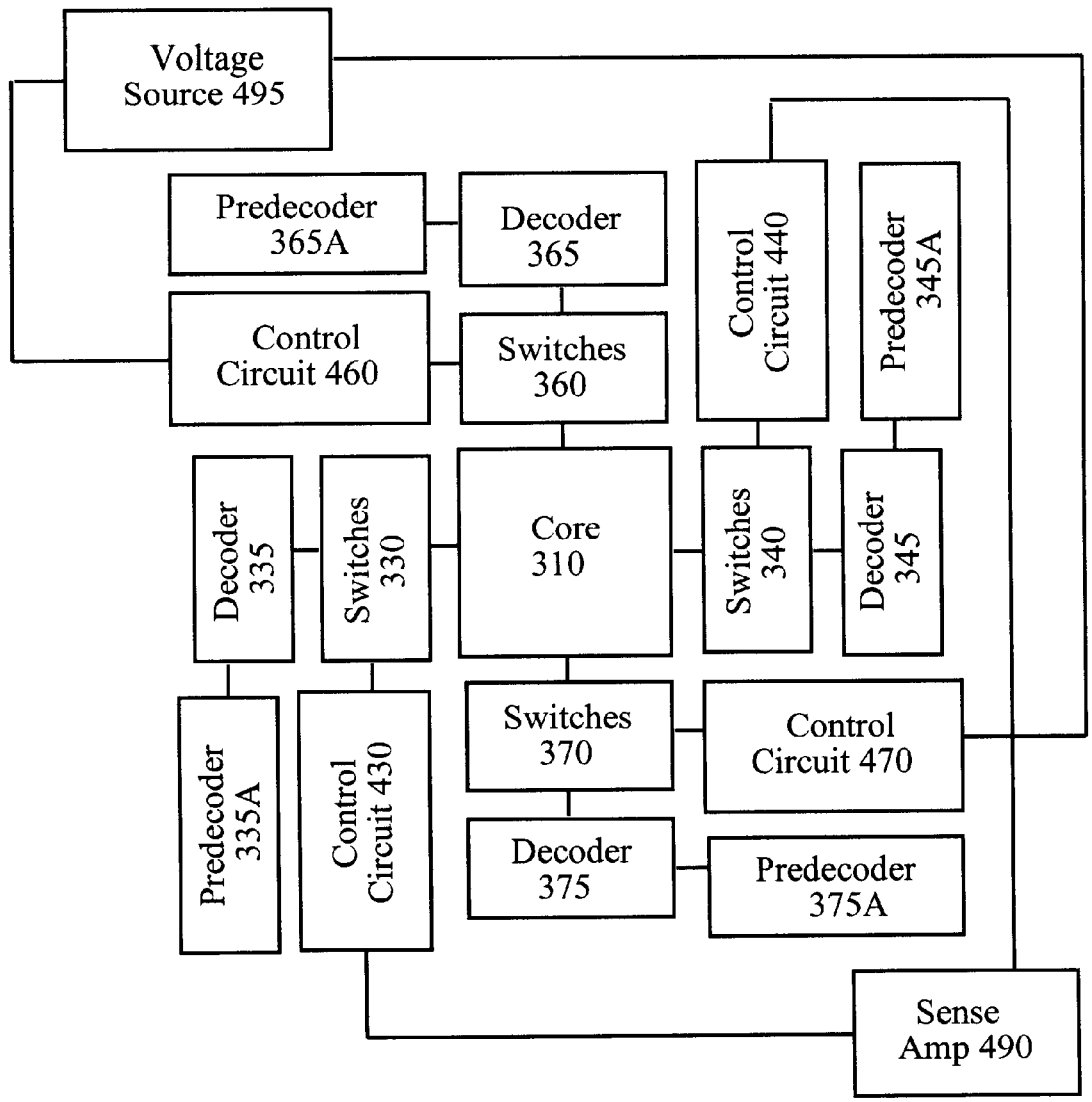

FIG. 5(C) illustrates a third configuration example associated with short circuit defect detection of test circuit 300(D) in accordance with the method described above with respect to FIG. 3(B). In this example, control circuits 460 and 470 are controlled to connect both ends of the vertical conductive paths to voltage source 495, and control circuits 430 and 440 are controlled to connect both ends of the horizontal conductive paths to sense amplifier 490. Address signals are then transmitted to predecoders 335A/345A/365A/375A and decoders 335/345/365/375, thereby causing selected switches to connect a selected horizontal conductive path to sense amplifier 490, and a selected vertical conductive paths to voltage source 495. Sense amplifier 490 generates signals associated with each selected horizontal path indicating the presence or absence of short circuit defects whose location is identified by the address signals.

Note that the layouts shown in FIGS. 4, 5A, 5B, and 5C are representational only and not to scale. For example, as known to those skilled in the art, core 310 is typically much larger than the periphery elements (including predecoders, decoders, switches, control circuits, sense amplifiers, and voltage sources). Thus, defects are less likely to occur in the periphery than in core 310. In accordance with the present invention, core 310 is formed using tight design rules, whereas the periphery elements are formed using very loose design rules. In this manner, the present invention further minimizes the probability of having defects in the periphery.

As described previously, the test structure of the present invention can be formed with any number of conductive materials used in the fabrication process. In accordance with one embodiment, the periphery is formed with conductive layers only up to metal 2 (M2), thereby allowing the wafers to be tested earlier in the fabrication process.

Although the present invention has been described in considerable detail with reference to certain preferred embodiments thereof, other embodiments are possible.

Therefore, the spirit and scope of the appended claims should not be limited to the description of the preferred embodiments contained herein.

I claim:

1. A method for identifying defects associated with process steps performed during the fabrication of an integrated circuit on a semiconductor wafer, the method comprising the steps of:

forming a first conductive path during a first process step, the first conductive path being connected between a first terminal and a second terminal via a first switching circuit;

forming a second conductive path during a second process step, the first conductive path being connected between the first terminal and the second terminal via a second switching circuit; and connecting the first and second conductive paths to the first and second terminals by sequentially turning on the first switching circuit to connect the first conductive path to the first and second terminals, and then turning on the second switching circuit to connect the second conductive path to the first and second terminals.

2. The method according the claim 1, wherein the method further comprises the steps of:

connecting the first terminal to a voltage source; and
connecting the second terminal to a sense amplifier;

wherein an open circuit defect analysis is performed during the step of sequentially connecting the first and second conductive paths by detecting a current through the first conductive path using the sense amplifier when the first switching circuit is turned on, and then detecting a current through the second conductive path using the sense amplifier when the second switching circuit is turned on.

3. The method according the claim 1, wherein the method further comprises the steps of:

forming a conductive segment adjacent to the first conductive path, the conductive segment being close to the first conductive path;

forming a third conductive path during a third process step such that the third conductive path is connected to the conductive segment, the third conductive path being connected between a third terminal and a fourth terminal via a third switching circuit;

connecting the first and second terminals to a voltage source such that the first conductive path is raised to a first voltage level when the first switching circuit is turned on;

connecting the third and fourth terminals to a sense amplifier; and performing a short circuit defect analysis by detecting a current on the third conductive path using the sense amplifier when the third switching-circuit is turned on.

4. The method according the claim 3, wherein the steps of forming the first conductive path and forming the conductive segment adjacent to the first conductive path are performed simultaneously.

5. The method according the claim 1, wherein the method further comprises forming a plurality of bypass circuits, each bypass circuit having a first segment connected to the first conductive path a second segment connected to the second conductive path, and a pass transistor connected between the first segment and the second segment.

6. The method according the claim 5, wherein the step of forming the first segment of each bypass circuit and the step of forming the first conductive path are performed simultaneously, and the step of forming the second segment of each bypass circuit and the step of forming.the second conductive path are performed simultaneously.

7. The method according the claim 5, wherein the method further comprises the step of performing an open circuit defect analysis by detecting a current through the first conductive path using a sense amplifier when the first switching circuit is turned on, and, if an open circuit defect is detected on the first conductive path, locating the open circuit defect by turning on the pass transistors of selected bypass circuits such that current passes through a portion of the second conductive path located between the selected bypass circuits, thereby bypassing a portion of the first bypass circuit including the open circuit defect.

8. A method of defect analysis associated with process steps performed during the fabrication of an integrated circuit on a semiconductor wafer, the method comprising the steps of:

connecting a first conductive path formed during a first process step between a first terminal and a second terminal via a first switching circuit;

connecting a second conductive path formed during a second process step between the first terminal and the second terminal via a second switching circuit, wherein the second path is independent of the first conductive path;

applying an electrical power source to the first terminal;

controlling the first switching circuit and the second switching circuit to sequentially connect the first conductive path between the first terminal and the second terminal and then the second conductive path between the first terminal and the second terminal;

detecting the electrical power source at the second terminal as the first conductive path and the second conductive path are sequentially connected between the first terminal and the second terminal.

9. The method of claim 8, wherein the method further comprises the step of performing an open circuit defect analysis during the controlling and detecting step by detecting a current through the first conductive path using a sense amplifier when the first switching circuit is turned on, and then detecting a current through the second conductive path using the sense amplifier when the second switching circuit is turned on.

10. The method of claim 8, wherein the method further comprises the step of identifying process problems associated with process steps in the manufacture of the integrated circuit on the semiconductor wafer by providing data regarding open circuit defects and short circuit defects in conductive paths, vias, and contacts to generate the integrated circuit.

11. The method of claim 8, wherein the method further comprises the step of performing the method on a plurality of test circuits uniformly dispersed on the semiconductor wafer to generate statistical data to identify a problem associated with a particular process step.

12. The method according the claim 8, wherein the method further comprises the steps of:

forming a conductive segment adjacent to the first conductive path, the conductive segment being close to the first conductive path;

forming a third conductive path during a third process step such that the third conductive path is connected to the conductive segment, the third conductive path being connected between a third terminal and a fourth terminal via a third switching circuit;

connecting the first and second terminals to the power source such that the first conductive path has a predetermined voltage level when the first switching circuit is turned on;

connecting the third and fourth terminals to a sense amplifier; and performing a short circuit defect analysis by detecting a current on the third conductive path using the sense amplifier when the third switching circuit is turned on.

13. The method of claim 12, wherein the method further comprises the step of precisely identifying the location of the short circuit.

14. The method of claim 13, wherein the method detects defects down to a part-per-million (PPM) level.

* * * * *